United States Patent [19]

Martinson

[11] 4,387,341

[45] Jun. 7, 1983

[54] MULTI-PURPOSE RETIMER DRIVER

[75] Inventor: Lloyd W. Martinson, Haddonfield, N.J.

[73] Assignee: RCA Corporation, New York, N.Y.

[21] Appl. No.: 263,125

[22] Filed: May 13, 1981

[51] Int. Cl.³ .......................... H03K 3/027; H03K 5/15
[52] U.S. Cl. ......................................... 328/73; 328/75;
328/103; 364/569; 377/69; 377/73
[58] Field of Search ...................... 328/37, 72, 73, 74,
328/75, 103, 105; 307/221 R

[56] References Cited

U.S. PATENT DOCUMENTS

| | | | |
|---|---|---|---|
| 3,113,273 | 12/1963 | Tendick | 328/103 |
| 3,716,783 | 2/1973 | Deering | 328/73 |
| 4,127,823 | 11/1978 | Frost | 328/75 |
| 4,151,472 | 4/1979 | Watanabe et al. | 328/75 |

Primary Examiner—John S. Heyman
Attorney, Agent, or Firm—Joseph S. Tripoli; Donald W. Phillion

[57] ABSTRACT

A general purpose retiming circuit comprising a timing signal source for generating timing signals, a plurality of N registers arranged in a row in a given order with each register having an input terminal, an output terminal, and clock input terminal and responsive to timing signals supplied thereto to transfer the signal supplied to said input terminal means to said output terminal. There is provided a serial input terminal for supplying a serial input signal thereto. Also provided are N switches arranged in the given order and each having first and second input terminals and an output terminal which is connected to the input terminal of a corresponding register of said row of N registers, and with the first input terminal of a first of the N switches being connected to the serial input terminal and the first input terminal of each of the remainder of the N switches being connected to the output terminal of the register preceding the corresponding register in the row of registers. Further provided in logic for supplying an N bit input signal in parallel manner to the second input terminals of the N switches. The N switches are actuated under control of timing signals generated by the timing signal source to selectively connect the first or second input terminals thereof to the output terminal thereof. Still further provided are N parallel output terminals, serial output terminals and a logic circuit responsive to timing signals generated by the timing signal source to selectively connect the output terminals of the N registers to the N parallel output terminals, the second input terminals of the N switches to the N parallel output terminals, and the output terminal of a selected register in the row of N registers to the serial output terminal.

6 Claims, 5 Drawing Figures

MULTI-PURPOSE RETIMER DRIVER

The United States Government has rights in this invention under contract N00024-77-C-5112 awarded by the Department of the Navy.

This invention relates generally to retiming circuits and more particularly to a general retiming circuit capable of performing numerous serial and parallel retiming functions.

Many retiming functions are performed with the aid of shift registers. For example, a binary word can be read into a shift register in series under control of first timing means and then read therefrom in parallel under control of second timing means. Other prior art circuits provide for serial-in/serial-out processing of a binary word, parallel-in/serial-out, or parallel-in/parallel-out. All of the foregoing functions can be performed by known prior art circuits, usually shift register arrangements. While some prior art circuits will perform some of the above functions, no single known prior art circuit will perform all of the above functions in a simplified manner and with a relatively simple logic arrangement.

The present invention performs all of the above-mentioned functions and, in addition, has the capability of simultaneous parallel-in/parallel-out and serial-in/serial-out functions.

In accordance with a preferred form of the invention, there is provided a clock pulse source for generating clock pulses. Also provided is a plurality of N register means arranged in a row and representing successively increasing binary orders of magnitude and with each register means having a data input terminal, a data output terminal, and a clock input terminal responsive to a clock pulse supplied to said clock input terminal to transfer the signal supplied to said input terminal thereof to said output terminal thereof. Further provided are N parallel input terminal systems and N switching means for selectively connecting the said N parallel input terminal systems to the data input terminal of said N register means or, alternatively, to connect the data output terminal of each register means to the data input terminal of the next successive register means in said binary order of register means. Further provided are logic means for selectively receiving the output signals appearing on the data output terminals of said N register means, for receiving the signals appearing on said N parallel input terminal systems, or the signals appearing on the output terminal of selected register means in said row of register means.

Figure 1:
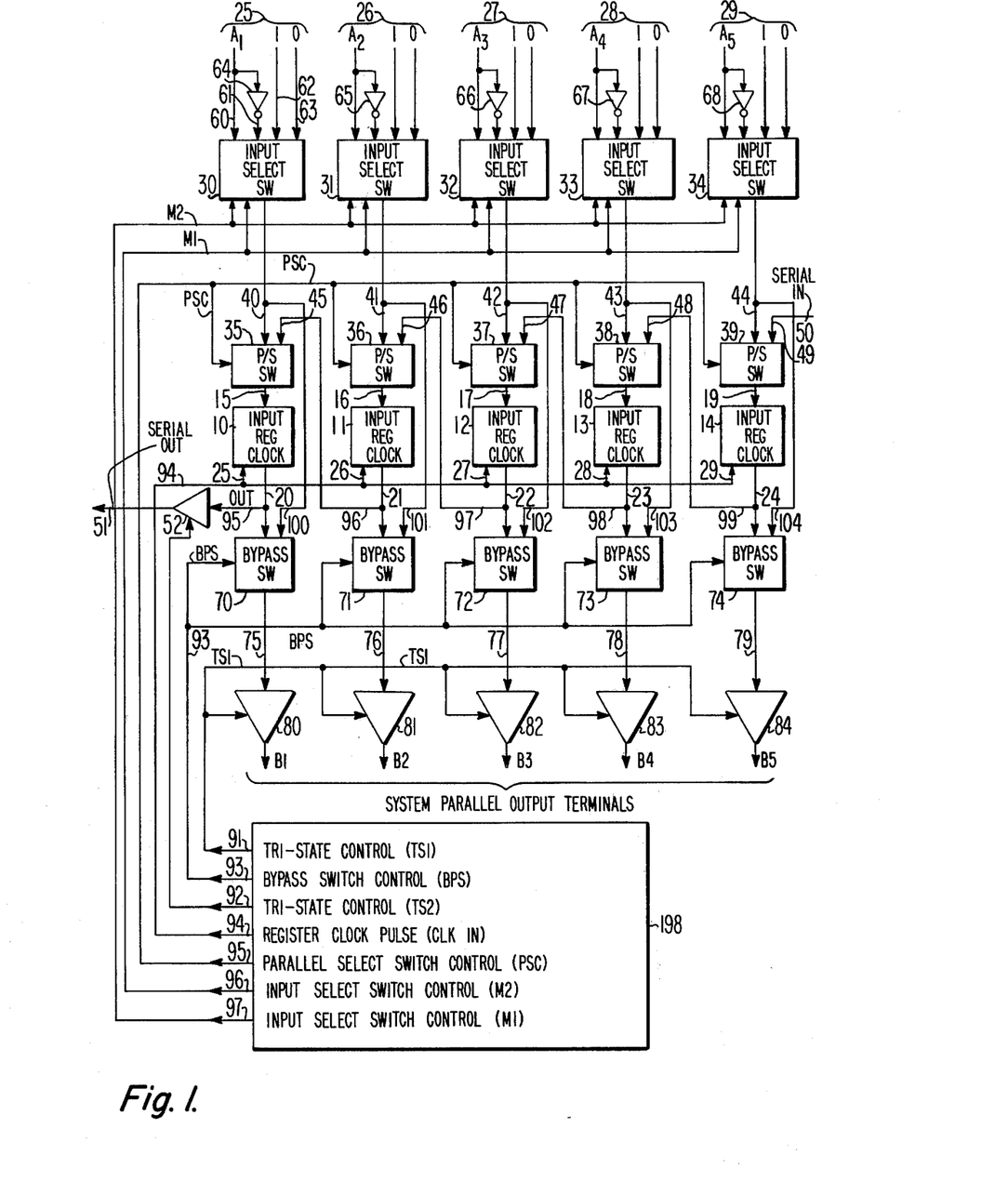
FIG. 1 is a logic diagram of the invention.

Referring now to FIG. 1, the five registers 10, 11, 12, 13, and 14, when connected together properly through the parallel/series (P/S) switches 35, 36, 37, 38, and 39, form a shift register which can receive an input signal on serial input lead 50 and shift such input signal therethrough to the output terminal 51.

The data flow for serial-in/serial-out signal retiming, which will be discussed in more detail later, is generally as follows. The input signal is supplied serially to input lead 50 and then flows through switch 39, input register 14, output lead 24, lead 99 to input lead 48, switch 38, register 13, lead 23, lead 98, switch 37, input register 12, lead 22, lead 97, switch 36, register 11, lead 21, lead 96, switch 35, register 10, and then through tri-state device 52 to the serial output lead 51.

The five switches 35–39 are two-state switches in that they function to connect either first input leads 40, 41, 42, 43, and 44 to the output leads 15, 16, 17, 18, and 19 respectively thereof or alternatively, when in the second state, to connect the input leads 45, 46, 47, 48, and 49 thereof to the output leads 15, 16, 17, 18, and 19, respectively. When switches 35–39 connect the input leads 45–49 to output leads 15–19, the five registers 10–14 form a shift register which serially shifts a signal supplied to serial input lead 50 to the serial output lead 51 under the control of clock pulses supplied via lead 94 to the clock input terminals 25, 26, 27, 28, and 29 of registers 10–14.

When the switches 35–39 are in their first state, that is, when they connect the input terminals 40–44 thereof to the output terminals 15–19 thereof, the system functions as a parallel input structure with selected ones of the inputs of the groups of input terminals 25, 26, 27, 28, and 29 being supplied to the input terminals 40–44 of switches 35–59 through the input select switches 30, 31, 32, 33, and 34. More specifically, each of the input select switches such as input select switch 30 can select any one of the four input signals supplied to the four input leads 60, 61, 62, and 63 thereof in response to select control signals supplied thereto via leads M1 and M2 and supply such selected signal to the corresponding parallel-serial switch 35. Thus, for example, a 5-bit input word supplied to the five data input leads $A_1$, $A_2$, $A_3$, $A_4$, and $A_5$ can be selected by input select switches 30–34 and supplied to the input terminals 40–44 of switches 35–39. Such 5-bit data word is then supplied through switches 35–39 in parallel to the input terminals 15–19 of registers 10–14.

Alternatively, if it is desired to enter the complement of the 5-bit signal supplied to leads $A_1$–$A_5$ into registers 10–14, the input select switches 30–34 can be enabled by the proper control signals supplied via control leads M1 and M2 to select the signals appearing on the outputs of inverters 64, 65, 66, 67, and 68.

If it is desired to supply all binary 1's or all binary 0's to input terminals 40–44 of switches 35–39, of switches 30–34 are enabled to connect the leads containing all binary 1's, such as lead 62 of the group of input leads 25 or lead 63 of the group of leads 25, to input terminals 40–44 of switches 35–39.

It is evident that a 5-bit word can first be entered serially into registers 10–14 when switches 35–39 are in their second states to connect the inputs 45–49 thereof to the input terminals 15–19 of registers 10–14 and that the 5 bit-word subsequently appearing at the output terminals 20–24 of the five registers 10–14 can be read from said output terminals 20–24 in parallel through bypass switches 70–74, and then through tri-state devices 80–84 which are enabled at that time by a control signal being supplied thereto via tri-state control lead 91. The appropriate timing means source 198, to be described later herein, can comprise a counter which serially enters the five bits of a binary word supplied serially to the system on input lead 50 and when then enables tri-state devices 80–84 to supply the five bits in parallel manner to the five parallel output leads B1–B5. Simultaneously, if desired, the 5-bit word inputted to the system can be read therefrom in serial manner on output lead 51 through tri-state device 52 when such device 52 is enabled by a binary 1 control signal supplied thereto via tri-state control lead 92.

In the above description the short leads 20–24 have been described as the output terminals 20–24 of registers 10–14. Such short leads 20–24 also form one of the input terminals to bypass switches 70–74. Similarly, in many other instances herein, such short leads similar to leads 20–24, which serve both as an output terminal and an input terminal, are referred to as both type leads, in order to minimum use of reference characters.

In the foregoing paragraphs, it has been assumed that bypass switches 70–74, which can be similar in construction to P/S switches 35–39, have been enabled to supply the output of registers 10–14 to the tri-state devices 80–84 in parallel. Thus, after the entry of each 5-bit word into the five registers 10–14, the five tri-state devices 80–84 can be enabled to read-out such 5-bit word to output leads B1–B5 in parallel manner. Simultaneously, as described above, the 5-bit words entered into the system from serial input 50 are being supplied serially through enabled tri-state device 52 to output lead 51.

As mentioned above, the five bypass switches 70–74 are similar to the five P/S switches 35–39 in that they function to connect one of two inputs to a single output terminal. More specifically, for example, bypass switch 70 can connect either the output terminal 20 of register 10 or the bypass lead 100 to its output terminal 75, depending on whether a binary 1 or a binary 0 control signal is supplied to said bypass switch 70 via bypass switch control lead 93. The bypass lead 100 connects the output 40 of the input select switch 30 directly to one input of bypass select switch 70 so that when said switch 70 connects said bypass 100 to its output terminal 75, both the P/S switch 35 and input register 10 will be bypassed. Thus, the signal supplied from the output of select switch 30 will be connected directly to the input of the tri-state device 80 through bypass switch 70. In a similar manner, when the bypass leads 101, 102, 103, and 104 are connected to the outputs 76, 77, 78, and 79 of bypass switches 71–74, the output of the input select switches 31–34 will be, in fact, supplied directly to the input of the tri-state devices 81–84, thereby by-passing the parallel select switches 36–39 and the input registers 11–14. Thus, the signals supplied to the input leads 25–29 are outputted directly and in parallel, without retiming, to output terminals B1–B5 of the system when tri-state devices 80–84 are enabled and when bypass leads 100–104 to output terminals B1–B5.

Here again the system can operate simultaneously in parallel-in/parallel-out and serial-in/serial-out manner, since, while signals are being supplied in parallel to select ones of input leads 25 and 29 and are being outputted on parallel output leads B1–B5, a serial input signal can be supplied serially to input lead 50, shifted through registers 10–14, and then outputted serially on output lead 51 in the manner described above.

Figure 2:
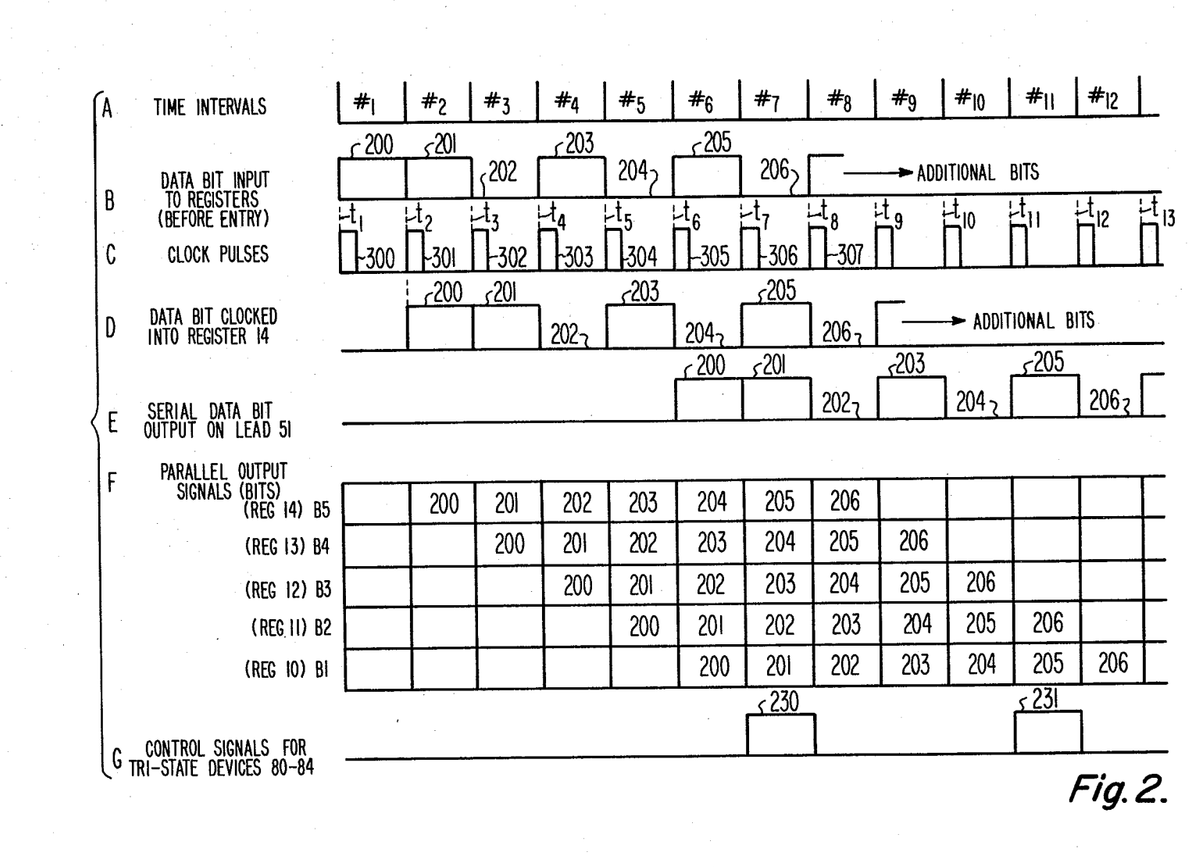
FIGS. 2, 3, and 4 are sets of timing waveforms to facilitate an understanding of the invention in its various modes of operation.

Referring now to FIG. 2, there are shown timing waveforms for serial-in/serial-out operation and for serial-in/parallel-out operation. In the timing diagrams of FIG. 2, as well as those of FIGS. 3 and 4, the various timing waveforms will be identified by the figure number followed by the letter designation of the waveform. Thus, for example, in FIG. 2 waveforms A, B, C,–G, will be identified as waveform 2A, 2B, etc. rather than as waveform A of FIG. 2.

Consider first the serial-in/serial-out mode of operation. The waveform 2B represents the signal supplied to the serial-in input terminal 50 of FIG. 1. Specifically during successive time intervals #1–#6 of waveform 2A, the bits 200 through 205 of waveform 2B appear consecutively at input terminal 50. Waveform 2D shows the bits 200–206 of waveform 2A after the first bit 200 has been clocked into register 14 and appears at the output terminal 24 thereof. Waveform 2E shows the bits 200–204 of waveform 2A after they have been clocked into registers 10–14 due to the occurrence of a series of five clock pulses 301–305 of waveform 2C and with the bit 200 appearing on the output terminal 20 of register 10 and also on output terminal 51 of FIG. 1 through enabled tri-state device 52. The five bits 200–204 of waveform 2E are the inputted bits 200–204 of waveform 2B after being advanced by five clock pulses 301–305.

Chart 2F shows the five signals outputted from registers 10–14 on output lines B1–B5, respectively, as a function of the operating time intervals #1–#12 of waveform 2A. For example, during time interval #3 of waveform 2A the bits 201 and 200 appear, respectively, at output terminals B5 and B4.

The input signal of waveform 2B is referenced to signal bit 200 beginning at time interval #1 in that clock pulse 300 of waveform 2C places bit 200 on the input 50 but not yet entered into register 14. The clock pulses of waveform 2C are supplied to registers 10 through 14 via clock input lead 94 of FIG. 1 from timing source 198. Such clock pulses initially enter the serially received bits of waveform 2B into register 14 through P/S switch 49 and subsequently through P/S switches 45, 46, 47, and 48 and input registers 10, 11, 12, and 13 in the manner generally described above. More specifically, the incoming bits will then pass in serial order through switch 38, register 13, switch 37, register 12, switch 36, register 11, switch 35, register 10, and through tri-state device 52 to serial output terminal 51.

While it is to be understood that the serially received data must be first entered through P/S switch 29 and then into input register 14 and subsequently into the remaining P/S switches 38–35 and input registers 13–10 in serial manner, it will be assumed for ease of description that in both the serial-in/serial out and the serial-in/parallel-out modes of operation bits 200–204 have been clocked into registers 10–14 by clock pulse 305 and that time $t_6$ of FIG. 2 is the starting point of the description of the operation. Specifically, as indicated above, and as shown in waveform 2F at time interval #6, the original bits 200–204 of waveform 2B appear at the outputs 20–24 of registers 10–14. Thus, bit 201 appearing at the output register 11 is the next input bit to register 10 on the next clock pulse. Similarly, bits 202, 203, and 204 appearing at the outputs of registers 12, 13, and 14 provide the next input bits to registers 11, 12, and 13 respectively. Also during time period $t_6$ the next input bit to register 14, which is bit 205 of waveform 2B, appears on serial input lead 50 and will be entered into register 14 at time $t_7$ by pulse 306.

Since the operation of all the registers is the same in response to each clock pulse of waveform 2C supplied to registers 10–14, only the transfer of bits from register 11 to register 10 will be discussed. Specifically, as each of the clock pulses of waveform 2C occurs, the bit supplied to input terminal 15 of register 10 from the output terminal 21 of register 11 will be the only bit considered. Thus, as stated above, during time interval #6, bit 201 of waveform 2B is present at output 21 of register 11 and will be clocked into register 10 at time $t_7$ by clock pulse 306. The bits 202, 203, and 204 will, during time interval #6, appear at the outputs of registers 12–14 and, upon the occurrence of clock pulse 306 at time $t_7$ will be entered into registers 11, 12, and 13, respectively, as shown during time period #7 in chart 2F.

When the next clock pulse 307 of waveform 2C occurs at time $t_8$ bit 202, appearing at the output of register 11 during time interval time interval #7, is entered into register 10 for the time period #8, as indicated in chart 2F. The bits in the remaining registers 11–14 are also advanced one stage in the manner described above upon the occurrence of clock pulse 307. In this manner, the stream of bits supplied to the serial input lead 50 are propagated through registers 10—13 and appear serially on serial output lead 51.

To effect serial-in/parallel-out operation the tri-state devices 80–84 and the control pulses of waveform 2G are provided. Specifically, for example, when bits 200–204 of waveform 2E appear at the output terminals 20–24 of registers 10–14 the complete 5-bit word formed thereby can then be supplied in parallel through bypass switches 70–74 (when switches to receive the outputs from registers 10–14) and then to output leads B1–B5, assuming the tri-state devices 80–84 are enabled by the tri-state control signal 230 (TSI) of waveform 2G which is supplied from timing logic 198 via lead 91. A second TSI pulse 231 of waveform 2G will supply the next 5-bit word from the output terminals 20–24 of registers 10–14 to the output terminals B1–B5 of the system.

Figure 3:
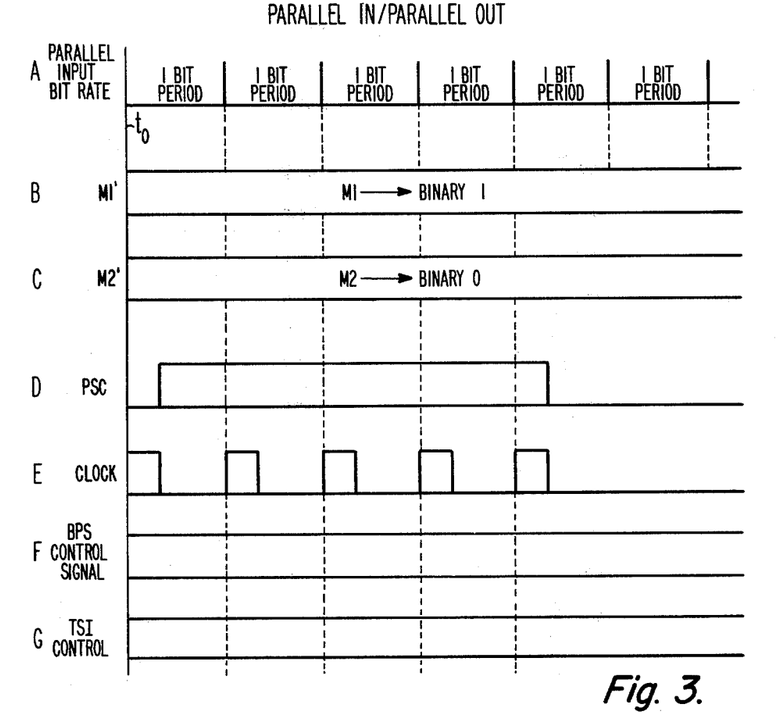

Referring now to FIG. 3, there is shown the timing waveform for the parallel-in/parallel-out mode of operation. In this mode, as discussed generally above, the signals are supplied from a selected one of the four input terminals of each of the five groups of input terminals designated generally by reference characters 25–29 of FIG. 1, and with the selection being made by control signals M1' and M2' which are supplied to input select switches 30–34 via control leads M1 and M2.

In the parallel mode of operation, a 5-bit word is coupled from the five select switches 30–34 to the five parallel/serial switches 35–39 which are enabled to pass the signal from select switches 30–34 rather than from the outputs of the previous register, as discussed above. In FIG. 3, waveform 3A represents the bit rate bit at which the parallel words are received. More specifically, each bit period of waveform 2A represents the reception of one 5-bit word in parallel manner. Waveforms 2B and 2C represent the control signals M1' and M2' on the M1 and M2 control leads which are supplied to switches 30–34 via leads 96 and 97 from timing logic 198 (FIG. 1). In waveforms 2B and 2C it is assumed, as an example, that M1 carries a high level or binary 1 signal and that M2 carries a low level or binary 0 signal, which signals will be assumed to select the $A_1$–$A_5$ input terminals. In the parallel-in/parallel-out mode the parallel select switch signal PSC, shown in waveform 3D, is a high level signal which causes bypass switches 70 through 74 to pass the signals appearing on the output terminals 20–24 of registers 10–14 rather than the signals appearing on by-pass leads 100–104. The signals appearing on output terminals 75–79 of by-pass switches 70–74 are supplied to the inputs of tri-state devices 80–84 which are enabled by the TSI control signal of waveform 3G to pass such signals to output terminals B1–B45 of the system. If desired, the output bits from select switches 30–34 can be supplied directly to the input terminals of tri-state devices 80–84 by causing by-pass switches 70–74 to be connected to leads 100–104 under control of the BPS control signal of waveform 3F which is generated by the timing control logic 198 of FIG. 1.

The clock pulses of waveform 3E function in the same manner as the clock pulses of waveforms 2B and specifically clock the signals appearing at the output of P/S switches 35–39 into the registers 10–14 and to the output terminals 20–24 of said registers 10–14.

Figure 4:
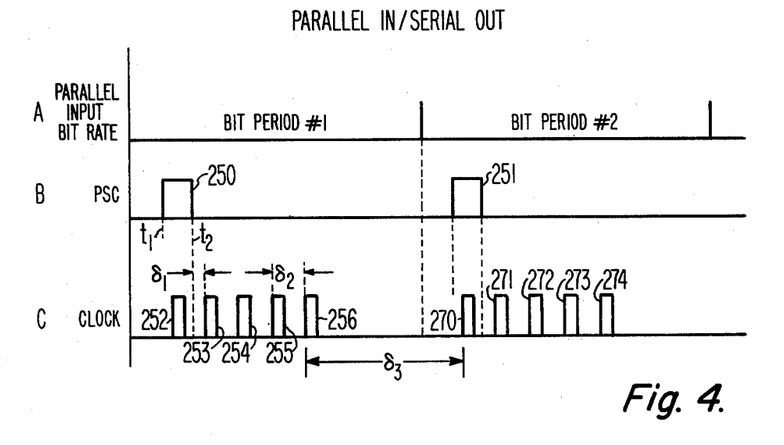

Referring now to FIG. 4, there is shown the timing waveforms for the parallel-in/serial-out mode of operation. In FIG. 4, waveform 4A shows bit periods with which correspond to the bit periods of waveform 3A. As in the case of the timing waveforms of FIG. 3, the 5-bit word is supplied in parallel manner from select switches 30–34 during the time period $t_1$–$t_2$ when pulse 250 functions to enable said P/S switches 35–39 to select the output signal (bits) supplied from select switches 30–34. During the occurrence of pulse 250 a clock pulse 252 of waveform 4C occurs which supplies the 5-bit word appearing at the output of P/S switches 35–39 into the registers 10–14.

Before a second 5-bit word is supplied to the input registers 10–14 from select switches 30–34 the first 5-bit word must be serially clocked out of the five registers 10–14 onto serial output lead 51 of FIG. 1. Such advancing of the 5-bit word out of registers 10–14 is accomplished by the sequential occurrences of the four clock pulses 253–256 of waveform 4C. More specifically, at time $t_2$ the PSC pulse 250 of waveform 4B, which enables P/S switches 35–39, terminates and a time period $\delta_1$ thereafter the next clock pulse 253 occurs. Such next clock pulse 253 of waveform 4C causes such output bits to be clocked one stage into the next succeeding register of registers 10 through 13 (the contents of register 14 will now be irrelevant) in the manner described hereinbefore with respect to the timing diagrams of FIG. 2.

The following subsequent clock pulse 254 waveform 4C clocks the new bits appearing at the output terminals 20 through 23 of registers 10–13 into the next succeeding registers. The foregoing process continues until all five bits of the data words have been supplied out onto serial output lead 51. It is to be understood as indicated above, that as the 5-bit word is serially clocked out of the shift registers 10–14 the contents of the vacated registers become irrelevant.

After the 5-bit word is serially clocked out of the five registers 10–14 the system will wait for the next PSC pulse 251 of waveform 4B to occur accompanied by the next clock pulse 270 which will clock in said next 5-bit word supplied from the five select switches 30–34 (FIG. 1) in the manner described above. The subsequent clock pulses 271–274 function to advance the second 5-bit data word out of the system and onto serial output terminal 51 in the manner discussed above.

The clock pulses of waveform 4C can be made continuously time synchronous by making the time period $\delta_2$ equal to $\delta_3$.

A detailed logic diagram of the master clock source and the various dividers, counters, and delay means required to produce the various timing waveforms of FIGS. 2, 3, and 4 will not be set forth herein since they are well within routine design engineering capability of one skilled in the art.

Figure 5:
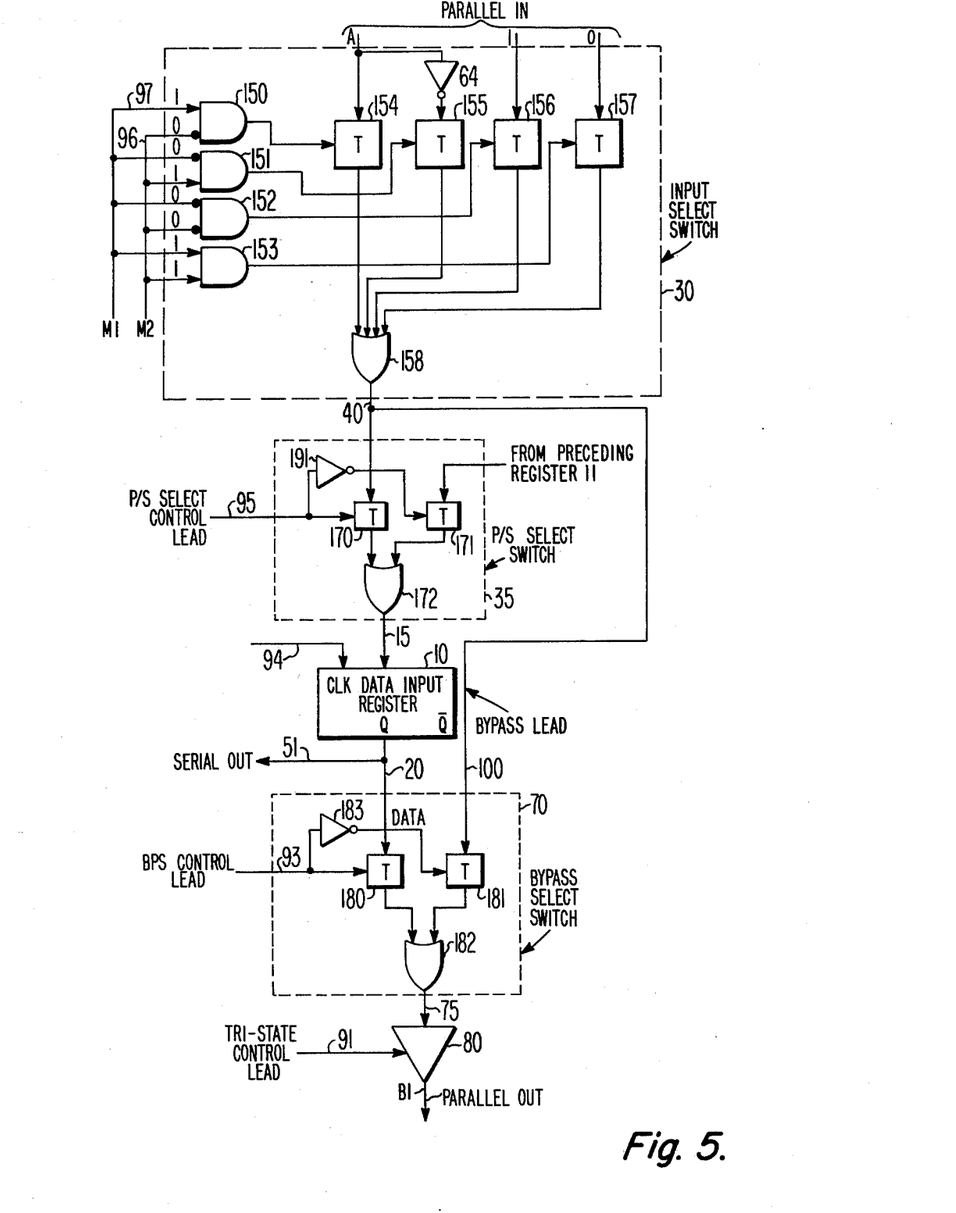
FIG. 5 is a more detailed logic diagram of one stage of the invention.

Referring now to FIG. 5, there is shown a more detailed drawing of the logic of one of the stages of the structure of FIG. 1. More specifically, FIG. 5 is a more detailed showing of the stage which includes register 10 of FIG. 1. Elements of FIG. 5 which correspond to elements of FIG. 1 are identified by the same reference character. Thus, the structure within the dotted blocks 30, 35, and 70 of FIG. 3 correspond to the input select switch 30, the parallel/serial switch 35, and the bypass switch 70 of FIG. 1. The various leads 96, 97, 93, 94, 40, 20, 100, 75, 91, 51, and B1 of FIG. 3 correspond to similarly identified leads of FIG. 1.

The control leads M1 and M2, also identified by reference characters 97 and 96, are connected to the inputs of each of AND gates 150–153 in such a manner that various combinations of binary 1's and 0's on control leads M1 and M2 will produce a binary 1 output from a selected one of AND gates 150–153. For example, a binary 1 and a binary 0 being supplied to the two control leads M1 and M2 will produce an output from AND gate 150 because of the inverting nature of one of the input terminals thereto. Similarly, binary 0's supplied to the two input leads M1 and M2 of AND gate 152 will produce a binary 1 output therefrom because both input terminals thereof are inverting. Such binary 1 output will enable transmission gate 156 to supply a binary 1 therethrough and then through the OR gate 158 to the parallel select switch 35. Thus, each of the transmission gates 154–157 can be selectively energized to supply the input signal supplied thereto through OR gate 158 to the parallel select switch 35.

Referring now to the parallel-serial select switch 35 of FIG. 3, it can be seen that only one or the other of the two transmission gates 170 and 171 are enabled by the power select control signal supplied to the power select control lead 95 because of the effect of inverter 191. Specifically, a binary 1 will enable transmission gate 170 to supply the output from OR gate 158 via OR gate 172 to data input terminal 15 of register 10. On the other hand, a binary 0 supplied to P/S select control lead 95 will be inverted by inverter 191 to enable transmission gate 171 to supply the output from the preceding register 11 (see FIG. 1) therethrough and then through OR gate 172 to data input 15 of register 10.

The clock pulses of timing waveform 2C are supplied via lead 94 to the clock input of register 10 to transfer the data from the data input thereof to the Q output thereof. The Q output is then supplied via lead 20 and transmission gate 180 to OR gate 182 when transmission gate 180 is enabled by a binary 1 appearing on the BPS control lead 93. On the other hand, when a binary 0 is supplied to BPS control lead 92 it is inverted to a binary 1 by inverter 183 to enable transmission gate 181, thereby connecting the output of OR gate 158 directly to the input of OR gate 182 and thence through tri-state device 80, when enabled, to parallel output lead B1. As discussed above, the tri-state device 80 is enabled by a binary 1 being supplied to the control lead 91 thereof from the timing logic 198 of FIG. 1.

The register 10 can be a conventional D-type flip-flop in which the data supplied to the data input lead terminal thereof is transferred to the Q output upon the occurrence of a clock pulse being supplied to the clock input via lead 94.

As mentioned above, sufficient delay must be built into either the D-type flip-flop 10 or in the Q output circuit so that the leading edge of the clock supplied pulse to the clock input of the flip-flop register 10 terminates before the data appearing at the data input 15 thereof is transferred to the Q output.

What is claimed is:

1. A retiming circuit comprising:
a clock pulse source for generating clock pulses;
a plurality of N registers arranged in a given successive order with each register having an input terminal, an output terminal, and clock input terminal means responsive to clock pulses supplied thereto to transfer the signal supplied to said input terminal to said output terminal;
a serial input terminal and means for supplying a serial input signal thereto;
N first switches each having first and second input terminals and an output terminal which is connected to the input terminal of a corresponding first register of said N registers, and with the first input terminal of the first switch of said N first switches being connected to said serial input terminal and the first input terminal of each of the remainder of said N switches being connected to the output terminal of the register preceding said corresponding register in said row of registers;
means for supplying an N bit input signal in parallel manner to the second input terminals of said N first switches;
means for providing timing control signals;
said N first switches responsive to said timing control signals to selectively connect the first or second input terminals thereof to the output terminal thereof;
N parallel output terminals;
serial output terminal; and
logic means for selectively connecting the output terminals of said N registers to said N parallel output terminals and the output terminal of a selected register in said N registers to said serial output terminals;
said logic means comprising N second switches each corresponding to one of said N registers and arranged in said given successive order and each having first and second input terminals and an output terminal with the first input terminal of each of said second switches being connected to the second input terminal of the corresponding first switch and with the second input terminal thereof being connected to the output terminal of the corresponding register;
said logic means further comprising gating means connecting said output terminals of said second switching means to said N parallel output terminals; and
said second switching means responsive to said timing control signals to selectively connect said first or second input terminals of each of said second switches to the output terminal thereof.

2. A retiming circuit comprising:
a clock pulse source for generating clock pulses;
N register means arranged in a given successive order with each register means having input terminal means, and output terminal means, and clock input terminal means responsive to a clock pulse signal supplied thereto to transfer the signal supplied to said input terminal means thereof to said output terminal means thereof;
N parallel input terminals;
N first switching means for selectively connecting said N parallel input terminals individually to the said input terminal means of said N register means or alternatively to connect the output terminal means of each register means to the said input terminal means of the next successive register means in said given order of register means; and logic means for selectively receiving in parallel manner the output signals appearing on the output terminal means of said N register means or the signals appearing on the output terminal of a selected register means of said N register means when said N first switching means is connecting the output terminal means of said each register means to the input means of the next successive register means.

3. A retiming circuit as in claim 2 in which said logic means further comprises:

N parallel output terminals; and

N second switching means for selectively connecting the said N parallel output terminals to the N output terminals of said N register means or to the N parallel input terminals.

4. A retiming circuit as in claim 2 and further comprising:

S signal sources for each input terminal of said N parallel input terminals; and third switching means for selectively connecting similar signal sources of said S signal sources to said N parallel input terminals.

5. A retiming circuit comprising:

a timing signal source for generating timing signals;

a plurality of N registers arranged in a row in a given successive order with each register having input terminal means, output terminal means, and clock input terminal means, and responsive to timing signals supplied to said clock input terminal means to transfer the signal supplied to said input terminal means to said output terminal means;

serial input terminal means and means for supplying a serial input signal thereto;

N first switches arranged in said given order and each having first and second input terminals and an output terminal which is connected to the input terminal means of a corresponding register of said row of N registers, and with the first input terminal of a particular first switch being connected to said serial input terminal means and the first input terminal of each of the remainder of said N first switches being connected to the output terminal means of the register preceding said corresponding register in said row of registers;

means for supplying an N bit input signal in parallel manner to the second input terminal of said N first switches;

means for actuating said N first switches under control of timing signals generated by said timing signal source to selectively connect the first or second input terminals thereof to the output terminals thereof;

N parallel output terminals;

serial output terminal means; and logic means responsive to timing signals generated by said timing signal source to selectively connect the output terminals of said N registers to said N parallel output terminals, the second input terminals of said N first switches to said parallel output terminals, or the output terminal of a selected register of said N registers to said serial output terminal means.

6. A retiming circuit as in claim 5 in which said logic means comprises:

N second switching means each corresponding to one of said N registers and each having first and second input terminals and an output terminal with the first input terminal thereof being connected to the second input terminal of the corresponding switch of said N first switches and with the second input terminal thereof being connected to the output terminal means of the corresponding register; and gating means responsive to timing signals from said timing signal source to connect the output terminals of said N second switching means to said N parallel output terminals.

* * * * *

UNITED STATES PATENT AND TRADEMARK OFFICE
CERTIFICATE OF CORRECTION

PATENT NO. : 4,387,341

DATED : June 7, 1983

INVENTOR(S) : Lloyd W. Martinson

It is certified that error appears in the above-identified patent and that said Letters Patent is hereby corrected as shown below:

In the Abstract:

Line 19, after "Further provided" change "in logic" to --is logic--;

Col. 2, line 45, "35-39, of switches" should be --35-39, then switches--;

Col. 5, line 23, "(when switches" should be --(when switched--;

Col. 5, line 67, "B1-B45" should be --B1-B5--.

Signed and Sealed this

Ninth Day of August 1983

[SEAL]

Attest:

GERALD J. MOSSINGHOFF

Attesting Officer    Commissioner of Patents and Trademarks